United States Patent
Hung et al.

(10) Patent No.: US 6,844,617 B2
(45) Date of Patent: Jan. 18, 2005

(54) PACKAGING MOLD WITH ELECTROSTATIC DISCHARGE PROTECTION

(75) Inventors: Chih-Pin Hung, Kaoshiung (TW); Juang-Sheng Chiang, Kaoshiung (TW)

(73) Assignee: Advanced Semiconductor Engineering Inc., Kaoshiung (TW)

( * ) Notice: Subject to any disclaimer, the term of this patent is extended or adjusted under 35 U.S.C. 154(b) by 0 days.

(21) Appl. No.: 10/292,303

(22) Filed: Nov. 12, 2002

(65) Prior Publication Data

US 2003/0094680 A1 May 22, 2003

(30) Foreign Application Priority Data

Nov. 16, 2001 (TW) .................................... 90128499 A

(51) Int. Cl.⁷ .......................... H01L 23/48; H01R 13/02
(52) U.S. Cl. .................... 257/678; 257/629; 257/774; 257/680; 257/668; 257/787; 257/355; 257/362
(58) Field of Search ................................. 257/629, 678, 257/774, 680, 355–363, 787, 668

(56) References Cited

U.S. PATENT DOCUMENTS

| | | | | |
|---|---|---|---|---|
| 4,321,432 A | * | 3/1982 | Matsutani et al. | 381/174 |
| 4,696,526 A | * | 9/1987 | Newton et al. | 439/68 |
| 5,218,510 A | * | 6/1993 | Bradford | 361/220 |
| 5,290,191 A | * | 3/1994 | Foreman et al. | 439/225 |
| 5,405,808 A | * | 4/1995 | Rostoker et al. | 29/841 |
| 5,408,190 A | * | 4/1995 | Wood et al. | 324/765 |
| 5,626,277 A | * | 5/1997 | Kawada | 228/41 |
| 5,935,502 A | * | 8/1999 | Ferri et al. | 264/272.15 |
| 6,054,760 A | * | 4/2000 | Martinez-Tovar et al. | 257/692 |
| 6,469,258 B1 | * | 10/2002 | Lee et al. | 174/261 |
| 6,613,979 B1 | * | 9/2003 | Miller et al. | 174/52.2 |
| 2002/0089044 A1 | * | 7/2002 | Simmons et al. | 257/668 |
| 2002/0141134 A1 | * | 10/2002 | Frutiger | 361/234 |
| 2002/0185305 A1 | * | 12/2002 | Chiang | 174/257 |
| 2003/0090861 A1 | * | 5/2003 | Lee et al. | 361/679 |
| 2003/0091673 A1 | * | 5/2003 | Hung et al. | 425/117 |
| 2003/0161491 A1 | * | 8/2003 | Yonehara et al. | 381/174 |

* cited by examiner

*Primary Examiner*—Alexander Oscar Williams
(74) *Attorney, Agent, or Firm*—Seyfarth Shaw LLP

(57) ABSTRACT

The present invention relates to a packaging mold with electrostatic discharge protection, comprising at least one recess for receiving at least one packaging substrate, the packaging substrate comprising an outer wall with a first height, the recess comprising an inner wall with a second height and the inner wall electrically connecting the outer wall of the packaging substrate, wherein the second height is larger than the first height. When separating the packaging substrate and the packaging mold, the duration of the outer wall connecting to the inner wall is extended, so that static electric charges generated when separating are conducted via the packaging mold preventing the dice to be packaged from damage due to electrostatic discharge to raise the yield rate of semiconductor package products thereby.

6 Claims, 6 Drawing Sheets

PACKAGING MOLD WITH ELECTROSTATIC DISCHARGE PROTECTION

BACKGROUND OF THE INVENTION

1. Field of the Invention

The present invention relates to a packaging mold, particularly to a packaging mold with electrostatic discharge protection.

2. Description of the Related Art

FIG. 1a to FIG. 1c, show a conventional packaging mold comprising a lower mold 1 and an upper mold (not shown), wherein the lower mold 1 combines the upper mold to package dice. The conventional packaging mold 1 comprises a recess 11 for receiving a packaging substrate 12. The recess 11 comprises an inner wall 111 to connect an outer wall 121 of the packaging substrate 12, wherein height of the inner wall 111 is substantially equal to the height of the outer wall 121. The recess 11 further comprises a plurality of position pins 112, 113 for passing through a plurality of position holes 122, 123 of the packaging substrate 12 in order to position the packaging substrate 12 into the recess 11.

The packaging substrate 12 comprises: a first copper-mesh layer 124, a dielectric layer 125, a second cooper-mesh layer 126, a plurality of position holes 122, 123, and an outer wall 121. The first cooper-mesh layer 124 is formed on the periphery of the packaging substrate 12 and extends to the outer wall 121 to electrically connect the inner wall 111 of the recess 11. The second cooper-mesh layer 126 is formed on the periphery of a bottom side of the packaging substrate 12 and extends to the outer wall 121 to electrically connect the inner wall 111 of the recess 11. The dielectric layer 125 is formed between the first copper-mesh layer 124 and the second copper-mesh layer 126.

The position holes 122, 123 are formed on the periphery of the packaging substrate 12 and penetrate through the top side and the bottom side. The position holes 122, 123 are used for receiving the position pins 112, 113 to position the packaging substrate 12 in the recess 11 of the mold 1. An inner side of the position holes 122, 123 is coated with a conducting layer or conducting materials to electrically connect the position pins 112, 113. In addition, the first copper-mesh layer 124 and the second copper-mesh layer 126 are electrically connected to the position holes 122, 123 and the electrically connected to the position pins 112, 113.

Static charge is often generated when objects of different materials connect and then separate. Therefore, dramatic static charge is generated when separating the packaging substrate 12 and the packaging mold 1 in encapsulation. In some conventional packaging mold, the outer wall 121 of the packaging substrate 12 is designed to electrically connect the inner wall 111 of the recess 11, and the position holes 122, 123 of the packaging substrate 12 is also designed to electrically connect the position pins 112, 113, so that static electric charges are conducted via the packaging mold 1, preventing damage to the dice on the packaging substrate 12.

Referring to FIG. 1b and FIG. 1c, injection pins 131, 132 are used for pushing the packaging substrate 12 out of the recess 11. As the reason that the duration of pushing is quite short, static charge still remains in the packaging substrate 12 instead of conducting completely via the inner wall 111 of the recess and the position pins 112, 113 after separating the packaging substrate 12 and the recess 11. The static charge generated when separating still damages the dice on the packaging substrate.

Therefore, it is necessary to provide an innovative and advanced packaging mold so as to solve the above problem.

SUMMARY OF THE INVENTION

One objective of the present invention is to provide a packaging mold with electrostatic discharge protection comprising at least one recess for receiving at least one packaging substrate; the packaging substrate comprising an outer wall with a first height, the recess comprising an inner wall with a second height and the inner wall being electrically connecting the outer wall of the packaging substrate, wherein the second height is larger than the first height. When separating the packaging substrate and the packaging mold, the duration of the outer wall connecting the inner wall is extended, so that static electric charges generated when separating are conducted via the packaging mold instead of remaining in the packaging substrate, to prevent the dice to be packaged from damage due to electrostatic discharge and to raise the yield rate of semiconductor package products thereby.

Another objective of the present invention is to provide a packaging mold with electrostatic discharge protection comprising at least one recess for receiving at least one packaging substrate; the packaging substrate comprising a plurality of position holes with a depth of a first height, the recess comprising a plurality of position pins with a height of a third height for passing through and electrically connecting the position holes, wherein the third height is larger than the first height. When separating the packaging substrate and the packaging mold, the duration of the position pins connecting the position holes is extended, so that static electric charges are conducted via the packaging mold and do not remain in the packaging substrate, preventing the dice to be packaged from damage due to electrostatic discharge to raise the yield rate of semiconductor package products thereby.

DETAILED DESCRIPTION OF THE INVENTION

Figure 1A:
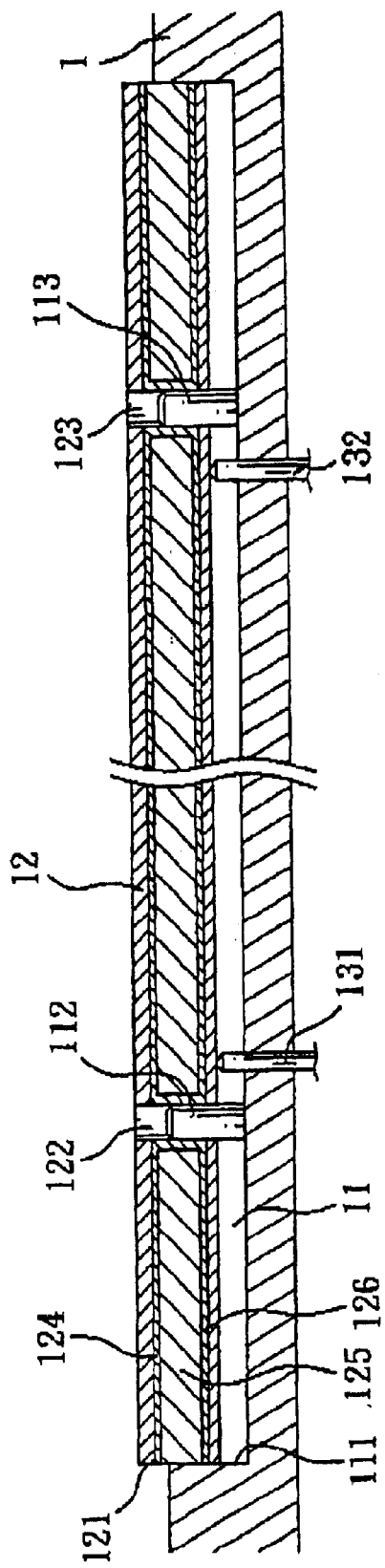
FIG. 1a to FIG. 1c show a cross-sectional view of the conventional packaging mold and the packaging substrate when separating.
Figure 1B:
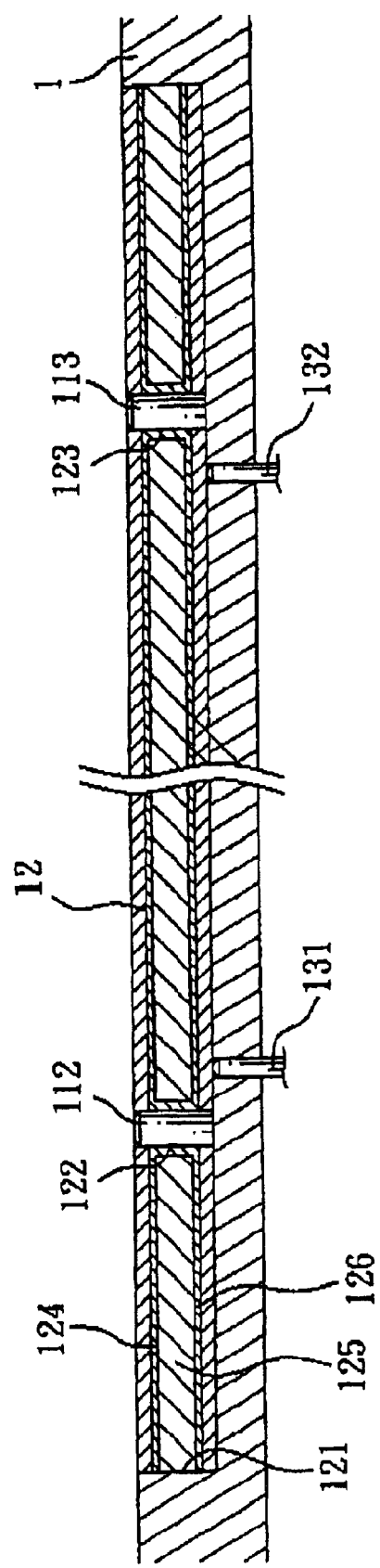
Figure 1C:
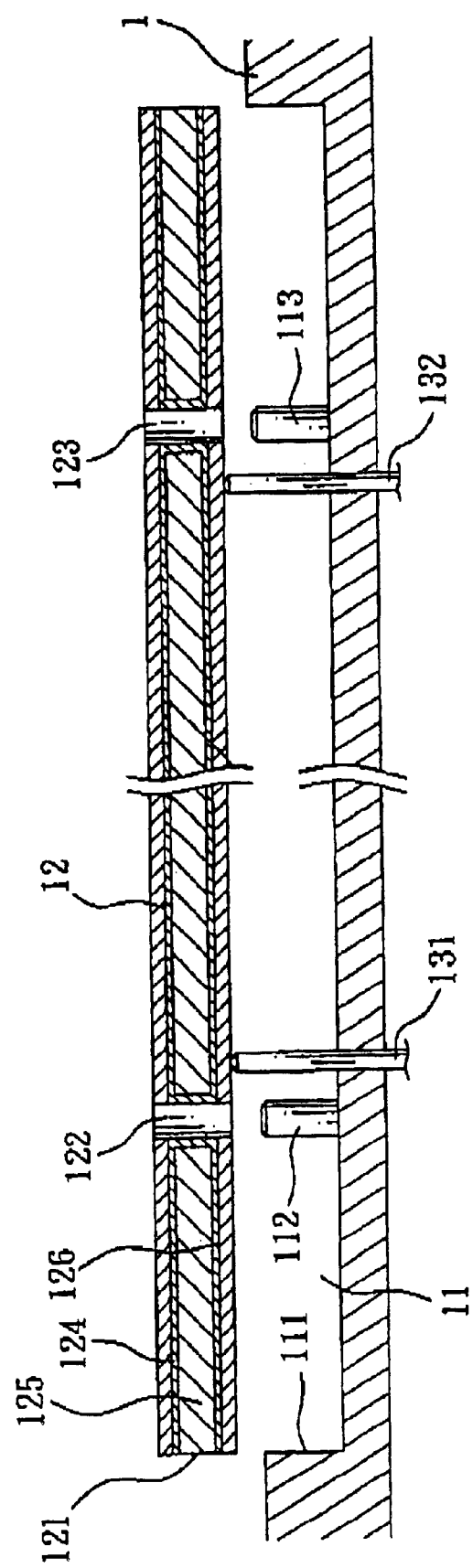
Figure 2:
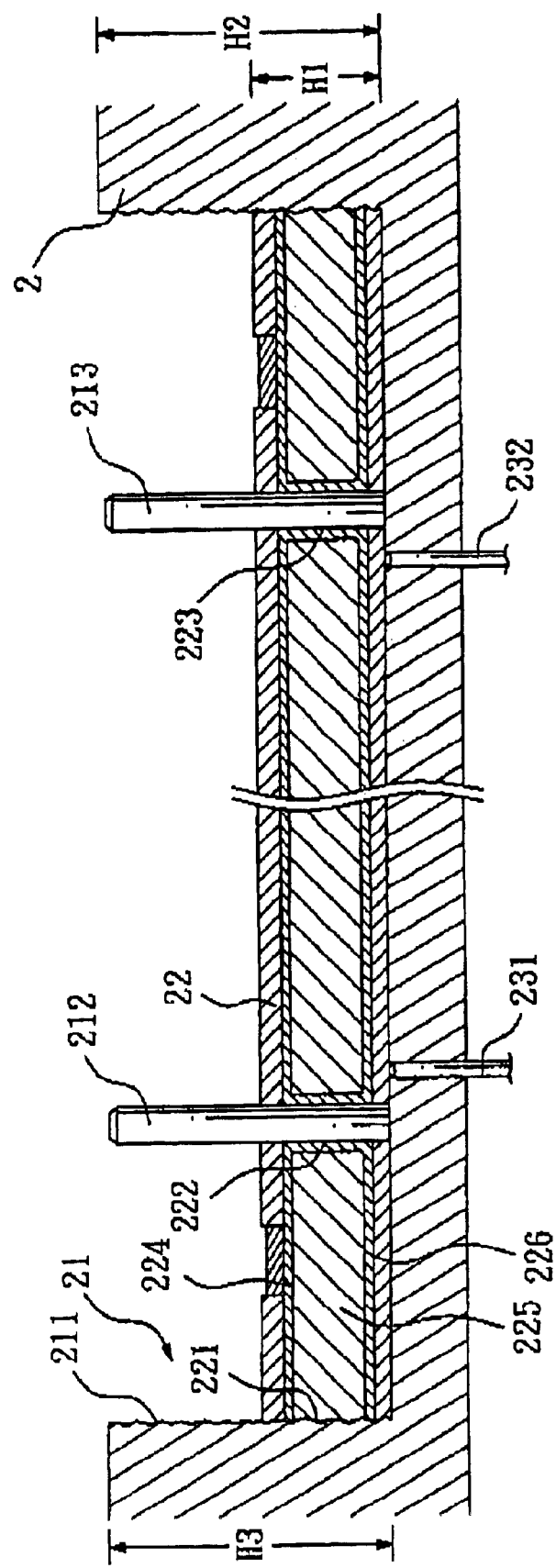
FIG. 2 shows a cross-sectional view of the packaging mold and the packaging substrate according to the invention.

FIG. 2 refers to a packaging mold 2 with electrostatic discharge protection. The packaging mold 2 comprises at least one recess 21, and each of the recess 21 is for receiving a packaging substrate 22. The recess 21 comprises an inner wall 211 and a plurality of position pins 212, 213. The walls of the position holes 222, 223 are in physical contact with position pins 212, 213 and are also electrically connected to the position pins 212, 213. Height of the outer wall 221 of the packaging substrate 232 is the first height H1, and height of the inner wall 211 of the recess 21 is the second height H2; wherein the second height H2 is larger than the first height H1.

The packaging substrate 22 comprises: a first copper-mesh layer 224, a dielectric layer 225, a second copper-mesh layer 226, a plurality of position holes 222, 223 and an outer wall 221. The first copper-mesh layer 224 is formed on the periphery of the packaging substrate 22 and extends to the outer wall 221 to electrically connect the inner wall 211 of the recess 21. The second copper-mesh layer 226 is formed on the periphery of a bottom side of the packaging substrate 22 and extends to the outer wall 221 to electrically connect the inner wall 211 of the recess 21. The dielectric layer 225 is formed between the first copper-mesh layer 224 and the second copper-mesh layer 226.

The position holes 222, 223 are formed on the periphery of the packaging substrate 22 and penetrate through the top side and the bottom side. The position holes 222, 223 are used for receiving the position pins 212, 213 to position the packaging substrate 22 in the recess 21 of the mold 2. The walls of the position holes 222, 223 are in physical contact with position pins 212, 213 and are also electrically connected to the position pins 212, 213. An inner side of the position holes 222, 223 is coated with a conducting layer or conducting materials to electrically connect the position pins 212, 213. In addition, the first copper-mesh layer 225 and the second copper-mesh layer 226 are electrically connected to the position holes 222, 223 and then electrically connected to the positions pins 212, 213.

The recess 21 further comprises a plurality of position pins 212, 213 for passing through a plurality of position holes 222, 223 of the packaging substrate 22 in order to position the packaging 22 in the recess 21. The position holes 222, 223 of the packaging substrate 22 are electrically connected with the position pins 212, 213 of the recess 21. Depth of the position holes 222, 223 is the first height H1, and height of the position pins is the third height H3; wherein the third height H3 is larger than the first height H1.

Figure 3:
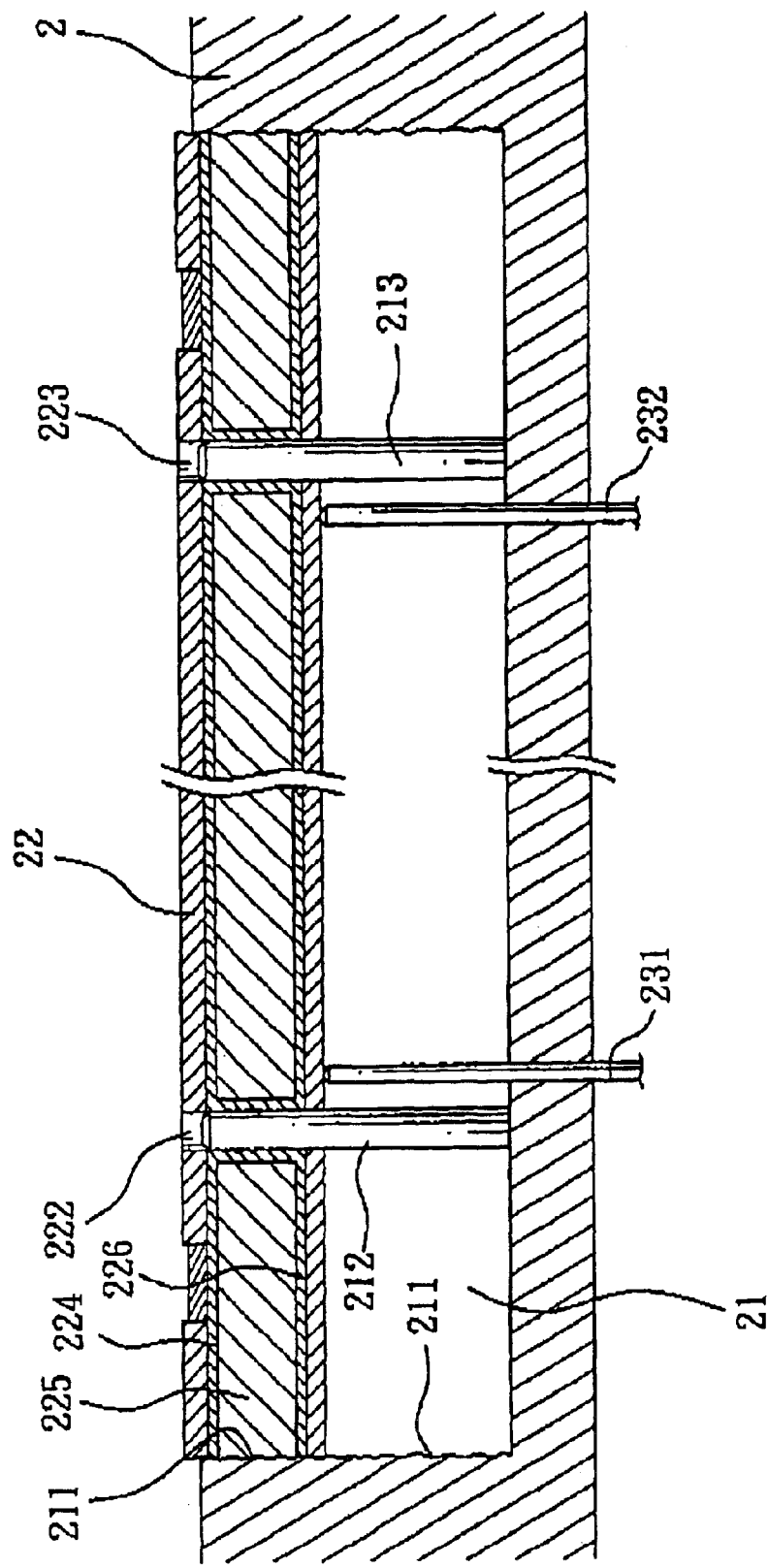
FIG. 3 shows a cross-sectional view of the packaging mold and the packaging substrate according to the invention when separating.
Figure 4:
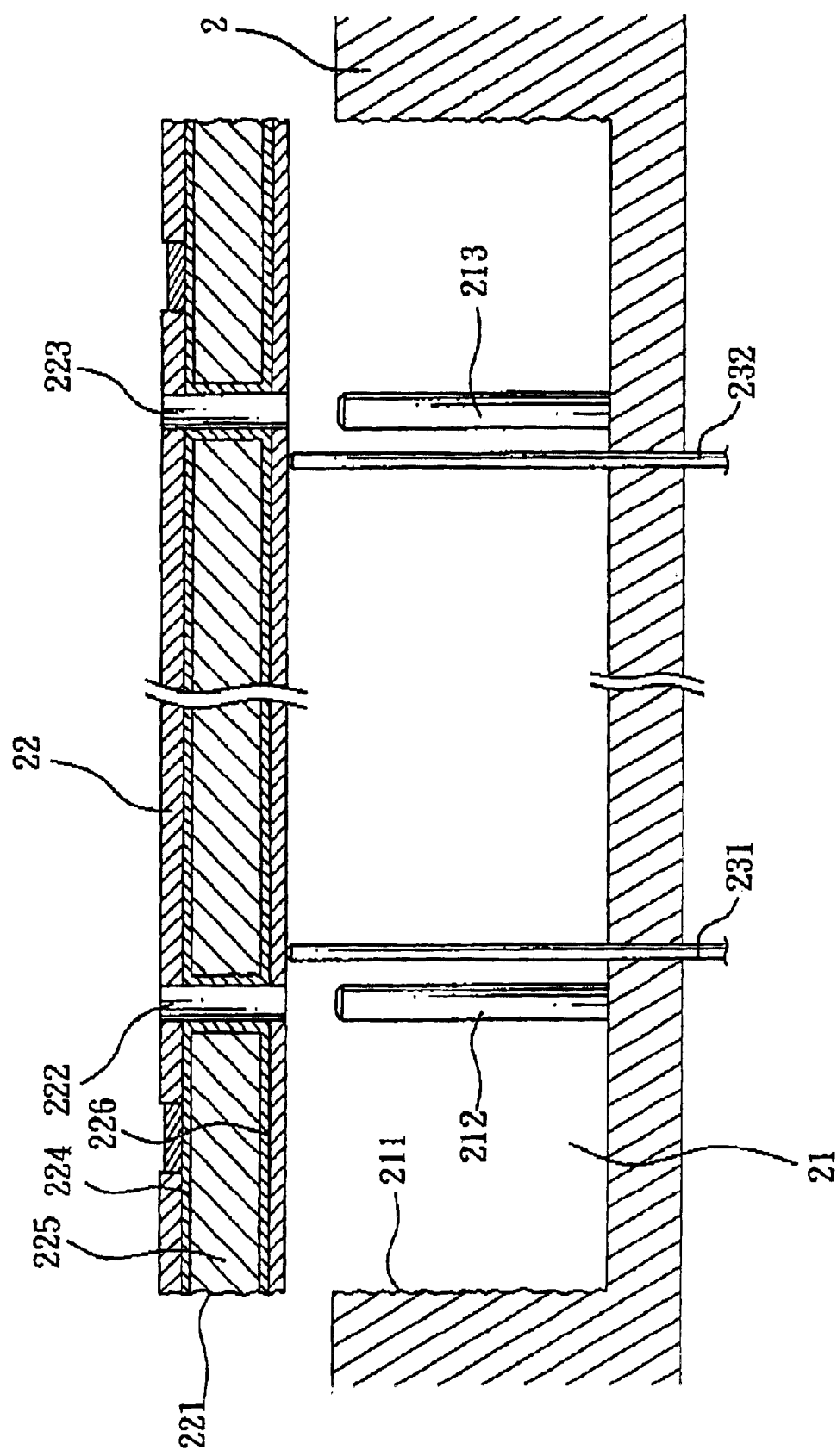
FIG. 4 shows a cross-sectional view of the packaging mold and the packaging substrate according to the invention after separating.

Referring to FIG. 3 and FIG. 4, because the height of the inner wall 211 (as the second height H2) of the recess 21 of the packaging mold 2 according to the invention is designed to be larger than the first height H1, the duration of separating the packaging substrate 22 and the packaging mold 2 can be extended when using injection pins 231, 232 to push the packaging substrate 22 out of the recess 21. As the reason, the static electric charges generated when separating can be conducted via the packaging mold 2 and do not remain in the packaging substrate 22.

Additionally, height of the position pins 212, 213 of the recess 21 (as the third height H3) according to the invention is also designed to be larger than the first height H1. The third height H3 can be designed to be larger than, equal to or smaller than the second height H2, and in the embodiment, the third height H3 is equal to the second height H2. In view of the third height H3 of the position pins 212, 213 being larger than the first height H1 of the position holes 222, 223, the duration of the position pins 212, 213 connecting the position holes 222, 223 is extended thereby. The static electric charges generated when separating can be conducted via the packaging mold 2 without remaining in the packaging substrate 2, and do not damage the dice on the packaging substrate 22.

According to the invention, there are two releasing paths for the static electric charges generated when separating the packaging substrate 22 and the packaging mold 2; one is via the outer wall 221 of the packaging substrate 22 and conducting to the inner wall 211 of the recess 21, and then via the packaging mold 2 to be conducted out; and the other is via the position holes 222, 223 of the packaging substrate 22 and conducting to the position pins 212, 213 of the recess 21, and then via the packaging mold 2 to be conducted out.

Besides, the static electric charges can be conducted out of the packaging mold 2 completely without remaining in the packaging substrate 22 because the heights of the inner wall 211 of the recess 21 and the position pins 212, 213 are elongated to extend the duration of electrical connection. The packaging mold 2 can prevent the static electric charges generated when separating from damaging the dice on the packaging substrate 22.

Preferably, a surface of the inner wall 211 of the recess 21 is roughed, to prevent the packaging substrate 22 from bending when pushing. As the reason, the packaging substrate 22 can be pushed out of the recess 21 of the packaging mold 2.

While an embodiment of the present invention has been illustrated and described, various modifications and improvements can be made by those skilled in the art. The embodiment of the present invention is therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A packaging mold with electronic discharge protection, comprising:
at least one recess for receiving at least one packaging substrate having an outer wall with a first height, each recess having an inner wall with a second height, the inner wall physically contacting and electrically connecting to the outer wall of the packaging substrate, the second height being larger than the first height.

2. The packaging mold according to claim 1, wherein the inner wall of the recess is roughed.

3. The packaging mold according to claim 1, the recess further comprising a plurality of position pins with a third height, the packaging substrate further comprising a plurality of position holes with a depth of the first height for putting around the position pins the walls of the position holes physically contacting and electrically connecting the positions pins to the substrate, wherein the third height is larger than the first height.

4. A packaging mold with electrostatic discharge protection, comprising:
at least one recess receiving at least one packaging substrate having a plurality of position holes with a depth of a first height, each recess having a plurality of position pins with a third height for passing through the positions holes the walls of the position holes physically contacting and electrically connecting to the substrate, the third height being larger than the first height.

5. The packaging mold according to claim 4, the packaging substrate further comprising an outer wall with a first height, the recess further comprising an inner wall with a second height, the inner wall physically contacting and electrically connected to the outer wall of the packaging substrate, wherein the second height is larger than the first height.

6. The packaging mold according to claim 5, wherein the inner wall of the recess is roughed.

* * * * *